United States Patent
Sleeman

(10) Patent No.: US 8,638,314 B2
(45) Date of Patent: Jan. 28, 2014

(54) CAPACITIVE TOUCH BUTTONS COMBINED WITH ELECTROLUMINESCENT LIGHTING

(75) Inventor: Peter Sleeman, Waterlooville (GB)

(73) Assignee: Atmel Corporation, San Jose, CA (US)

( * ) Notice: Subject to any disclaimer, the term of this patent is extended or adjusted under 35 U.S.C. 154(b) by 1176 days.

(21) Appl. No.: 12/511,907

(22) Filed: Jul. 29, 2009

(65) Prior Publication Data
US 2010/0097346 A1    Apr. 22, 2010

Related U.S. Application Data

(60) Provisional application No. 61/106,294, filed on Oct. 17, 2008.

(51) Int. Cl.
*G06F 3/045* (2006.01)

(52) U.S. Cl.
USPC .................. 345/174; 345/173; 178/18.01

(58) Field of Classification Search
USPC ................ 345/173–179; 178/18.1–18.04
See application file for complete search history.

(56) References Cited

U.S. PATENT DOCUMENTS

| | | | |
|---|---|---|---|
| 4,290,061 A | | 9/1981 | Serrano |
| 4,758,830 A | * | 7/1988 | Levien et al. .................. 345/174 |
| 5,239,152 A | * | 8/1993 | Caldwell et al. .............. 200/600 |
| 5,365,461 A | * | 11/1994 | Stein et al. ..................... 700/298 |
| 5,610,380 A | * | 3/1997 | Nicolaisen .................... 200/600 |
| 5,730,165 A | | 3/1998 | Philipp |
| 6,452,514 B1 | | 9/2002 | Philipp |
| 6,466,036 B1 | | 10/2002 | Philipp |
| 7,663,607 B2 | | 2/2010 | Hotelling |
| 7,875,814 B2 | | 1/2011 | Chen |
| 7,920,129 B2 | | 4/2011 | Hotelling |
| 8,031,094 B2 | | 10/2011 | Hotelling |
| 8,031,174 B2 | | 10/2011 | Hamblin |
| 8,040,326 B2 | | 10/2011 | Hotelling |
| 8,049,732 B2 | | 11/2011 | Hotelling |
| 8,179,381 B2 | | 5/2012 | Frey |
| 2005/0179673 A1 | | 8/2005 | Philipp |
| 2005/0206623 A1 | | 9/2005 | Hein et al. |
| 2009/0315854 A1 | | 12/2009 | Matsuo |

(Continued)

FOREIGN PATENT DOCUMENTS

| EP | 1986324 A1 | 10/2008 |
|---|---|---|
| WO | WO-03044956 A2 | 5/2003 |

(Continued)

OTHER PUBLICATIONS

U.S. Appl. No. 61/454,936, filed Mar. 21, 2011, Myers.

(Continued)

*Primary Examiner* — Kimnhung Nguyen
(74) *Attorney, Agent, or Firm* — Baker Botts LLP

(57) ABSTRACT

A capacitive touch sensor includes a layer of electro-luminescent (EL) material arranged between a first electrode and a second electrode, A controller includes a capacitance sensing circuit coupled to first and/or second electrode and arranged to measure a capacitive coupling associated with the first and/or second electrode. The controller is further operable to apply an EL drive signal across the first and second electrodes to cause the layer of EL material between the electrodes to illuminate. This provides a simple structure that is sensitive to objects adjacent a sensing region defined by the first and/or second electrodes, and which may also be readily illuminated by applying an EL drive signal across the electrodes.

21 Claims, 5 Drawing Sheets

(56) References Cited

U.S. PATENT DOCUMENTS

| | | |
|---|---|---|
| 2012/0242588 A1 | 9/2012 | Myers |
| 2012/0242592 A1 | 9/2012 | Rothkopf |
| 2012/0243151 A1 | 9/2012 | Lynch |
| 2012/0243719 A1 | 9/2012 | Franklin |

FOREIGN PATENT DOCUMENTS

| | | |
|---|---|---|
| WO | WO-2005036510 A1 | 4/2005 |
| WO | WO-2007146779 A2 | 12/2007 |
| WO | WO-2010043417 A1 | 2/2010 |
| WO | WO-2010043417 A2 | 4/2010 |
| WO | WO 2012/129247 | 9/2012 |

OTHER PUBLICATIONS

U.S. Appl. No. 61/454,950, filed Mar. 21, 2011, Lynch.
U.S. Appl. No. 61/454,894, filed Mar. 21, 2011, Rothkopf.
"International Application Serial No. PCT/EP2009/007471, Search Report mailed May 12, 2010", 4 pgs.
"International Application Serial No. PCT/EP2009/007471, Written Opinion mailed May 12, 2010", 7 pgs.

* cited by examiner

CAPACITIVE TOUCH BUTTONS COMBINED WITH ELECTROLUMINESCENT LIGHTING

RELATED APPLICATIONS

This application claims the benefit under 35 U.S.C. 119(e) of U.S. Provisional Patent Application Ser. No. 61/106,294, filed on Oct. 17, 2008, which is incorporated herein by reference in its entirety.

BACKGROUND

The invention relates to user interfaces capacitive sensors, and in particular to capacitive sensors having illumination associated with a sensing area of the sensor.

There is an increasing demand for robust and aesthetically pleasing user interfaces for controlling devices. Over recent years capacitive touch-sensitive sensing techniques, for example capacitive sensing techniques, have become well established and accepted in this field. Common examples of devices that may include touch-sensitive control panels are touch-sensitive display screens and touch-sensitive keyboards/keypads, e.g. as used for controlling consumer electronic devices/domestic appliances.

In many cases a designer may wish to provide illumination in association with sensing areas (i.e. the touch sensitive regions) of a sensor. For example, sensing areas may be illuminated to aid a user in identifying them in darkened conditions. Illumination of sensing areas may also be used to convey information, e.g. a sensing area may be illuminated to indicate that a function of an apparatus being controlled that is associated with the sensing areas is currently activated. Illumination may also be used for purely aesthetic reasons.

One known technique for illuminating capacitive sensors is to provide a light source in proximity to the sensing area. For example, one technique uses a capacitive sensor comprising a sensing element in the form of a splayed helical spring with a light emitting diode (LED) mounted on axis with the spring so as to illuminated an overlying cover panel from below. Another known technique is to use transparent conductor electrodes in conjunction with a light source behind the sensor and providing illumination of the sensing region through the sensor itself.

These known arrangements can be effective in providing illumination in the region of a sensor's sensing area, but the light source adds complexity to the overall sensor design. The provision of the light source also takes up additional space in the device, which can be particularly problematic in relatively small devices, such as cellular telephones.

There is therefore a need for simplified schemes for providing illumination of sensing areas in capacitive sensors.

SUMMARY

A capacitive touch sensor is provided including a layer of electro-luminescent (EL) material arranged between a first electrode and a second electrode, and a controller which includes a capacitance sensing circuit coupled to first and/or second electrode and operable to measure a capacitive coupling associated with the first and/or second electrode. The controller is further operable to apply an EL drive signal across the first and second electrodes to cause the layer of EL material between the electrodes to illuminate.

Thus a simple structure is provided that is sensitive to objects adjacent a sensing region defined by the first and/or second electrodes, and which may also be readily illuminated by applying an EL drive signal across the electrodes.

The controller may be operable to respectively apply the EL drive signal and measure the capacitive coupling associated with the first and/or second electrode in a time-multiplexed manner. Thus capacitive measurements may be made without interference from the EL drive signal.

However, in other embodiments, the controller may be operable to apply the EL drive signal and measure the capacitive coupling associated with the first and/or second electrode simultaneously.

For example, the controller may be operable to measure the capacitive coupling associated with the first and/or second electrode at a predefined phase of the EL drive signal selected to minimize interference. For example, the predefined phase of the EL drive signal may be a zero crossing of the EL drive signal or a phase at which a rate of change of the EL drive signal with time is minimized.

In another example, the EL drive may signal include a blanking period, and the controller may be operable to measure the capacitive coupling associated with the first and/or second electrode during the blanking period. For example, the blanking period may be a period in which the EL drive signal is maintained at a reference potential, e.g. a ground potential.

The capacitive touch sensor may include an EL signal amplifier for amplifying a signal from the controller in order to provide the EL drive signal. Thus the controller may have full control over the EL drive signal to be applied.

The capacitance sensing circuit may be based on mutual-capacitance measurement techniques, and thus may comprise a drive circuit operable to apply a capacitance measurement drive signal to the first electrode and a receive circuit operable to measure a component of the drive signal capacitively coupled to the second electrode as an indication of the capacitive coupling between the first and second electrodes.

The capacitive touch sensor may further include a switch arranged to selectively couple one or other of the EL drive signal and the capacitance measurement drive signal to the first electrode in response to a switching signal from the controller.

Alternatively, the capacitance sensing circuit may be based on self-capacitance measurement techniques, and may be coupled to the second electrode and operable measure a capacitive coupling of the second electrode to a reference potential.

The touch sensor may further include a switch arranged to selectively couple one or other of the EL drive signal and either a reference potential, a floating potential, or a facsimile of a signal applied to the second electrode, to the first electrode in response to a switching signal from the controller.

In some embodiments the first and/or second electrode may be transparent. Furthermore, the first and/or second electrode may have a shape selected to correspond to a desired illumination pattern for the touch sensor and/or or may be overlain by a mask to define a desired illumination pattern.

In some configurations a connection trace to the first and/or second electrode may be arranged to run away from the layer of EL material to avoid illumination of the layer of EL material adjacent the connection trace(s).

The controller may be further operable to process measured changes in the capacitive coupling to detect the presence of an object adjacent the touch sensor.

Capacitive touch sensors as provided herein may be incorporated into devices.

A method for providing an illuminated touch sensitive capacitive sensor is provided herein. The method includes providing a layer of electro-luminescent (EL) material arranged between a first electrode and a second electrode, measuring a capacitive coupling associated with the first and/ or second electrode, and applying an EL drive signal across the first and second electrodes to cause the layer of EL material between the electrodes to illuminate.

BRIEF DESCRIPTION OF THE DRAWINGS

For a better understanding of embodiments and to show how the same may be carried into effect reference is now made by way of example to the accompanying drawings in which.

DETAILED DESCRIPTION

Figure 1A:
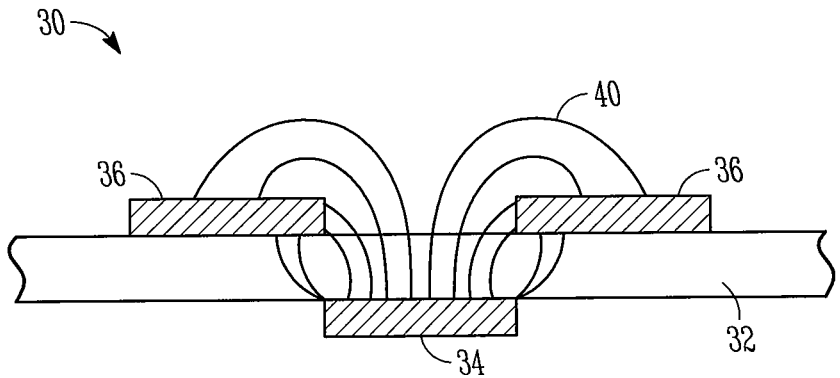
FIGS. 1A and 1B schematically show sectional views of a capacitive sensor employing conventional sensing techniques which may be used in embodiments. The sensor is shown in FIGS. 1A and 1B with a representation of overlying electric field lines when no pointing object is adjacent the sensor and when a pointing object is adjacent the sensor respectively.

Capacitive sensing techniques may be considered broadly to fall into two categories, namely those based on measuring the self-capacitance of an electrode (sometimes referred to as passive capacitive sensing techniques), and those based on measuring the mutual-capacitance between electrodes (sometimes referred to as active capacitive sensing techniques).

Self-capacitance capacitive sensing devices rely on measuring the capacitance of a sensing electrode to a system reference potential (e.g., an earth/ground). In broad summary, self-capacitance capacitive sensors employ sensing electrodes coupled to capacitance measurement circuits. Each capacitance measurement circuit measures the capacitance (capacitive coupling) of an associated sensing electrode to a system reference potential (e.g. a system ground). When there is no pointing object near to the sensing electrode, the measured capacitance has a background/quiescent value. This value depends on the geometry and layout of the sensing electrode and the connection leads to it, and so on, as well as the nature and location of neighboring objects, e.g. the sensing electrodes proximity to nearby ground planes. When a pointing object, e.g. a user's finger, approaches the sensing electrode, the pointing object acts as a virtual ground in proximity to the sensing electrode. This serves to increase the measured capacitance of the sensing electrode to ground. Thus an increase in measured capacitance is taken to indicate the presence of a pointing object. These principles can be applied to discrete (single button) measurements, and to two-dimensional position sensitive capacitive sensors. For example, a plurality of electrodes may be arranged on a surface to provide electrodes that define either an array of discrete sensing areas (regions), or rows and columns of electrodes providing for a plurality of sensing areas in a pollable matrix configuration.

Mutual-capacitance capacitive sensors differ from self-capacitance sensors in that they are based on measuring the capacitive coupling between two electrodes (rather than between a single sensing electrode and a system ground). As noted above, mutual-capacitance capacitive sensors are based on measuring the mutual capacitance between two electrodes. One electrode in the pair is commonly referred to as the drive (or transmit) electrode, while the other electrode is commonly referred to as the sense (or receive) electrode. The drive electrodes are also sometimes referred to as X-electrodes and the sense electrodes as Y-electrodes. This historically relates to the orientation of the different electrodes in some early examples of the mutual-capacitance capacitive sensors. However, the terms are sometimes still used today to distinguish the driven and sense electrodes regardless of their orientation, and even for non-matrix designs.

In a basic mutual-capacitance type capacitive sensor, the drive electrode is supplied with an oscillating drive signal (e.g. comprising one or more square wave logic-level pulses). The mutual capacitance between the drive and sense electrodes is determined by the extent to which a component of the drive signal is capacitively coupled to the sense electrode. The degree of coupling of the drive signal to the sense electrodes is determined by measuring the amount of charge transferred to the sense electrode by the oscillating drive signal.

Figure 1B:
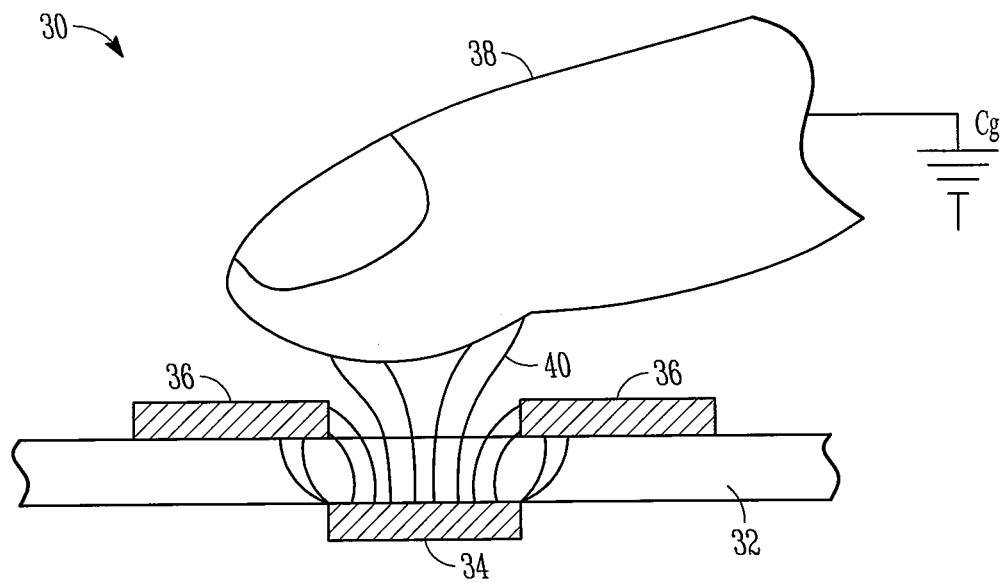

FIGS. 1A and 1B schematically show section views of a region of a mutual-capacitance type capacitive sensor 30 that may be used in accordance with some embodiments. The sensor 30 comprises a dielectric substrate 32 having a drive electrode 34 mounted on its lower surface (referring to the orientation in the figures) and a sense electrode 36 mounted on its upper surface. Although not shown in FIGS. 1A and 1B for simplicity, the sensor 30 will generally also comprise a cover panel on the side from which an object to be sensed normally approaches (on the upper side for the orientation shown in FIGS. 1A and 1B).

The drive electrode 34 in the example of FIGS. 1A and 1B is the form of a closed circle and the sense electrode 36 is in the form of a ring having a central opening broadly aligning with the drive electrode. In this example the sensor provides a single discrete circular touch sensitive area, but the same general principles apply to other types of sensor based on mutual-capacitance sensing techniques, e.g. those having differently shaped discrete electrodes, or those for providing continuous position estimates for a proximate object within a one- or two-dimensional sensing area.

Also shown in FIGS. 1A and 1B are schematic representations of electric field lines connecting between the drive and sense electrode as a result of a drive signal applied to the drive electrode. In effect the lines 40 provide a highly schematic pictorial representation of the capacitive coupling between the drive and sense electrodes. FIG. 1A schematically shows the electric fields when there is no object adjacent the sensor 30. FIG. 1B schematically shows the electric fields when there is an object adjacent the sensor (i.e. user's finger 38 having a capacitance $C_g$ to ground).

When there is no object adjacent the sensor (FIG. 1A), all the electric field lines represented in the figure connect between the driven electrode 34 and the sense electrode 36. However, when the user's finger 38 is adjacent the sensor (FIG. 1B), some of the electric field lines that pass outside of the substrate are coupled to ground through the finger. Thus fewer field lines connect between the drive and sense electrodes, and the measured capacitive coupling between them is accordingly reduced.

Thus measured changes in the amount of charge coupled between the drive electrode 34 and the sense electrode 36 can be used to determine if an object is adjacent the sensor (i.e. whether the electrical properties of the region into which the spilled electric fields extend have changed). This is a broad summary of the basic principles underlying mutual-capacitance capacitive sensing techniques. While the operational principles of mutual-capacitance based sensing are described above in the context of a sensor having drive and receive electrodes on opposing sides of a substrate, the same general principles are applicable to sensors having drive and receive electrodes that are adjacent to one another on the same side of a substrate.

It is possible to create touch responsive transparent or opaque sensing regions that can detect human touch through several millimeters of plastics or glass substrates. Described herein is a new structure for a touch button or touch sensor (including an x, y touchpad or touch screen) that combines part of the sensor electrode with one of the electrodes used in an Electro Luminescent (EL) lamp.

As noted above, capacitive measurement sensors, may use a transmit-receive process to induce charge across the gap between an emitting electrode and a collecting electrode (the transmitter and the receiver respectively, also referred to as X and Y electrodes). As a finger (or other object) interacts with the resulting electric field between the transmitter and receiver electrodes, the amount of charge coupled from transmitter to receiver is changed. A particular feature of this measurement is that most of the electric charge tends to concentrate near to sharp corners and edges (a well known effect in electrostatics). The fringing fields between transmitter and receiver electrodes dominate the charge coupling. Electrode design therefore tends to focus on the edges and the gaps between neighboring transmitter and receiver electrodes in order to maximize coupling and also to maximize the ability of a touch to interrupt the electric field between the two, hence giving the biggest relative change in measured charge. Large changes are desirable as they equate to higher resolution and equally to better signal to noise ratio.

A specially designed control chip can detect these changes in charge. It is convenient to think of these changes in charge as changes in measured coupling capacitance between transmitter and receiver electrodes (charge is rather harder to visualize). The control chip processes the relative amounts of capacitive change from various places around the sensor (i.e. from various sensing regions of the sensor) and uses this to either detect the presence of a touch on a touch button (e.g. a discrete sensing region of the sensor), or to compute the absolute location of touch as a set of x- and y-direction coordinates on a touchpad or touch screen. As noted above, a common desire is for the X (drive/transmit) and Y (sense/receive) electrodes to be transparent so that light can pass through the touch sensor to provide aesthetic and/or functional illumination effects.

As noted above, in addition to sensors based on mutual-capacitance, other sensor technologies included those based on self-capacitance measurement techniques. These measurement methods use only simple "open electrodes" i.e. the electrode has only one connection to the measurement chip and can detect changes in the capacitance of the electrode relative to earth ground. When a user touches such electrodes (either indirectly via an overlying insulating panel, or directly) the user's body capacitance to earth is added in parallel to the electrode's and so can be registered by the control chip. Such capacitive sensing methods may equally be applied to embodiments of the invention described herein.

Electro Luminescent (EL) lamps are light sources which use a structure that sandwiches a layer of light emitting phosphor or other material that fluoresces under application of high voltage, between two conductive layers that may be composed of carbon, ITO (Indium Tin Oxide), PEDOT (a conductive polymer poly(3,4-ethylenedioxythiophene)), copper or other conductive substance. The upper electrode in the structure, i.e. on the light emitting side, is generally fabricated from a transparent material to allow the light to propagate towards the user.

Generally, the voltages and drive levels used by EL lamps tend to make them hard to integrate with capacitive sensors. In particular, attempts to integrate EL lamps for backlighting of capacitive sensors tend to lead to one or more layers of transparent shielding material having to be added between the top electrode layer of an EL lamp and the overlying capacitive touch button. This is clearly disadvantageous from a cost and thickness point of view.

Embodiments herein seek to address this by integrating one or more capacitive touch sensing electrodes with an EL lamp construction so that a pair of electrodes can be provided that combines the function of an EL lamp with the electrodes of the touch sensor.

Figure 2A:
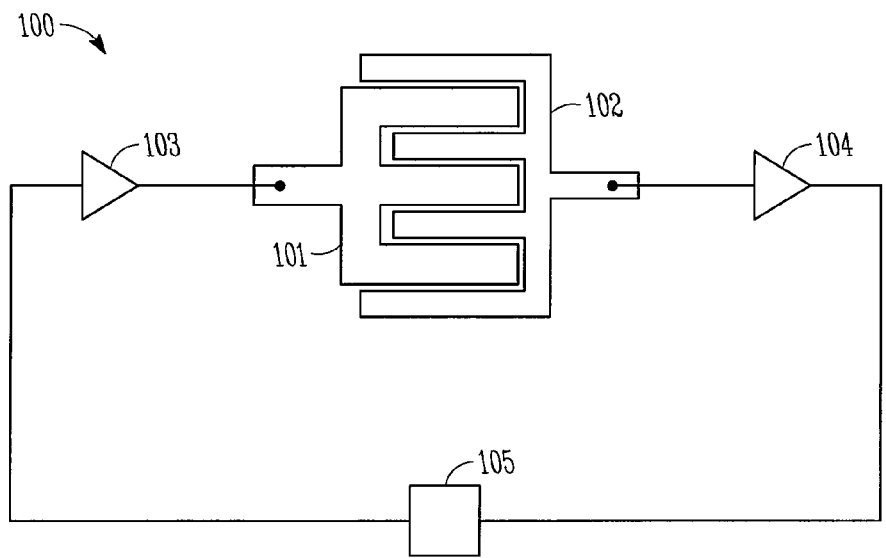
FIGS. 2A and 2B schematically show capacitive sensors employing conventional sensing techniques which may be used in other embodiments.
Figure 2B:
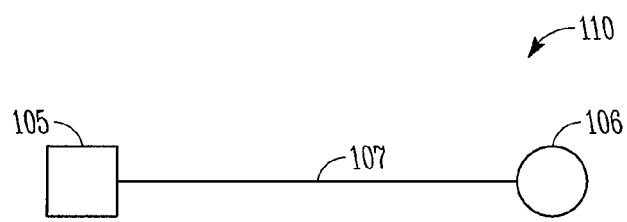

FIG. 2A schematically shows a typical arrangement for a sensor 100 comprising a capacitive transmit/receive type of touch button and FIG. 2B schematically shows a typical arrangement for a sensor 110 comprising an open circuit electrode type arrangement.

Firstly, the transmit/receive electrode arrangement of FIG. 2A shall be described. The sensor 100 comprises a control chip 105, a transmit electrode 101 and a receive electrode 102. The control chip comprises a drive circuit 103 providing a drive signal to the transmit electrode 101 and a receive circuit 104 for measuring a component of the drive signal that is capacitively coupled to the receive electrode 102. The control chip 105, drive circuit 103 and receive circuit 104 are schematically shown in FIG. 2A as functionally separate elements. However, this is simply for ease of representation. In practice the functionality of the drive circuit 103 and receive circuit 104 may be provided within a single integrated circuit chip comprising the controller 105, for example a suitably programmed general purpose microprocessor, field programmable gate array, or application specific integrated circuit, for example, or may be provided by discrete componentry.

Thus the driver circuit 103 of the control chip 105 is connected to a first transmit electrode 101. The electrode 101 couples capacitively to a second receive electrode 102 which in turn is connected to the control chip's 105 receive circuit 104. The structure shown is arranged such that the two electrodes can be placed on the same plane, i.e. a one-layer circuit board pattern, or on the same layer of conductive film comprising for example Indium-Tin-Oxide (ITO) or PEDOT on an insulating substrate. These capacitive-sensing aspects of the sensor 100 of FIG. 2A are conventional.

Thus the operational principles of the sensor 100 of FIG. 2A so far as the basic capacitive sensing is concerned broadly correspond with the operation principles of the sensor 30 of FIGS. 1A and 1B. However, the sensor 100 of FIG. 2A differs from the sensor 30 of FIGS. 1A and 1B in that the transmit/drive and receive/sense electrodes of FIG. 2A are interdigitated in a common plane on one side of a substrate, rather than facing one another on opposing sides of the substrate, such as schematically shown in FIGS. 1A and 1B. Thus with the sensor 100 of FIG. 2A it is also possible to place each electrode on a separate layer if desired.

The open circuit electrode arrangement of FIG. 2B uses a similar control chip 105 adapted to drive and sense the electrode 106 over a single connection 107. This style of sensing is one layer by design and so the electrode 106 could be placed in any location where a touch button or control is required.

Figure 3:
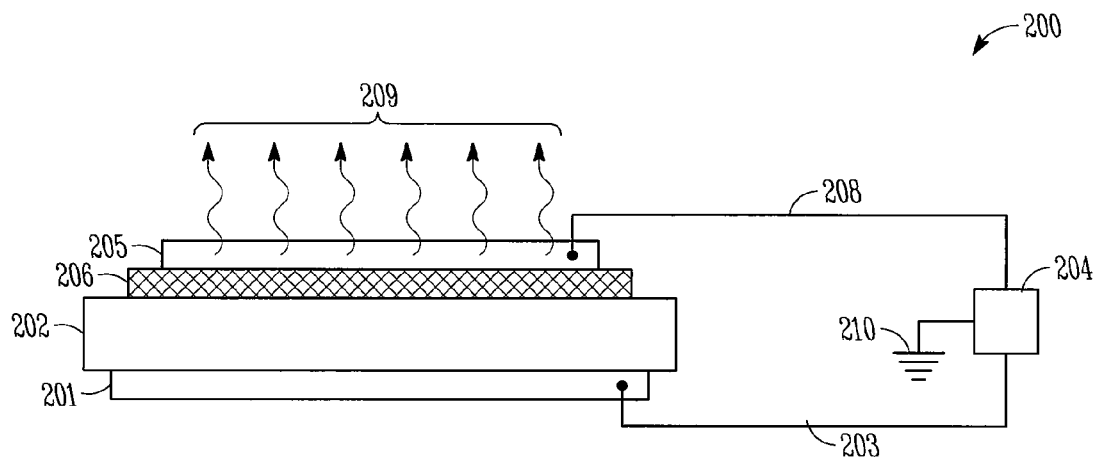
FIG. 3 schematically shows a sectional view of a conventional electro-luminescent (EL) lamp.

FIG. 3 schematically shows a typical construction for an EL lamp 200. A first electrode 201 is placed on the lower side of an insulating substrate 202 and is connected to a first potential 203 that is provided by a drive circuit 204 for the EL lamp. A second electrode 205 is placed on the upper side of the substrate 202 such that it completely or partly overlaps the lower electrode 201. The second/upper electrode 205 is also connected to the EL drive circuit 204 via a second connection at a second potential 208. A layer of phosphorescent material 206 is sandwiched between one of the electrodes 201, 205 and the substrate 202. In this specific example the layer of phosphorescent material 206 is sandwiched between the second electrode 205 and the substrate 202, but this is not significant. Under the application of suitable potentials 203, 208 to the electrodes 201, 205, the phosphorescent material layer 206 will emit light 209. Typically the potentials 203, 208 provided by the EL drive circuit 204 are such that a potential difference of tens to hundreds of volts is applied across the electrodes 201, 205 with a sinusoidal or square modulation at frequencies on the order of hundreds to thousands of Hertz. It is also common that one of the two potentials 203 or 208 will be at the potential of the EL drive circuit's 0V (ground) power supply connection 210.

Figure 4A:
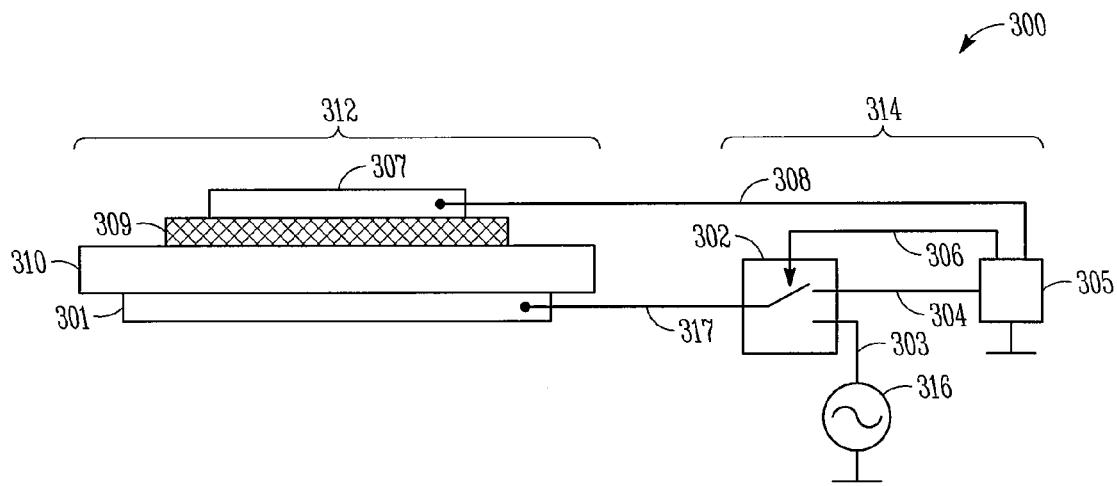
FIG. 4A schematically shows aspects of an apparatus comprising a combined EL lamp and a capacitive type touch sensor according to an embodiment.

FIG. 4A schematically shows an apparatus 300 comprising a combined EL lamp and transmit/receive capacitive type touch sensor for providing an illuminated capacitive sensing region according to an embodiment of the invention. The apparatus 300 may be broadly considered to comprise a structural component 312 (which may also be referred to as the sensor element) and an associated circuitry component 314 for controlling the illuminatable sensor element 312.

The sensor element 312 has a generally layered structure in this example and comprises a first (lower) electrode 301, a substrate 310, a layer of phosphorescent material 309, and a second (upper) electrode 307. The first and second electrodes may be respectively referred to as lower and upper electrodes to reflect their orientation in FIG. 4A. It will be appreciated, however, that "upper" and "lower" (and related terminology) are used merely for ease of explaining the relative placements of some features for the orientations shown in the figures. The terms should not be interpreted as requiring any specific spatial orientation of a sensor when in normal use. Generally, the phrases upper, and sometimes front, will be used to refer to the side of the illuminatable sensor element from which an object to be sensed finger would normally approach.

Thus the layered structure of the sensor element component 312 of the apparatus 300 of FIG. 4A is broadly similar to that of a conventional EL lamp (such as shown in FIG. 3), and the structure 312 may be constructed broadly in accordance with the corresponding well-known techniques. For example, the substrate 310 may comprise a plastic sheet, the phosphorescent material 309 may comprise any known electro-luminescent material, and the electrodes 301, 307 may comprise films of ITO deposited on the substrate/phosphorescent material in the usual way.

The circuitry component 314 of the sensor 300 comprises an EL drive source 316 for providing an EL drive signal 303 to the sensor element 312 and a control chip 305 (controller) comprising a conventional capacitive sensor drive (transmit) channel for providing a conventional capacitance sensor drive (transmit) signal 304, and a conventional capacitive sensor sense (receive) channel for measuring a conventional capacitance sensor sense (receive) signal. The principles underlying the EL drive signal source 316 for the EL drive signal 303 and the capacitance sensor drive and sense channels of the control chip 305 may be conventional. However, the circuitry component 314 of the apparatus 300 further comprises a switch 302 arranged to selectively couple the EL drive signal 303 or the capacitance sensor drive signal 304 to the lower electrode 301 in response to a switching signal 306 provided by the control chip 305 on a switch line from the control chip 305 to the switch 302. The switch 302 is coupled to the lower electrode 301 via a lower electrode drive line 317. The upper electrode 307 is coupled to the control chip 305 via an upper electrode return line 308.

The apparatus 300 of FIG. 4A is operable to function in both a capacitive sensing mode (i.e. having a touch-sensing function) and in an EL lamp mode (i.e. having an EL lamp function).

To operate in the capacitive sensing mode, the control chip 305 controls switch 302 via switching signal 306 such that the capacitive measurement drive signal 304 from the drive channel of the control chip 305 is coupled to the lower electrode 301 via the lower electrode drive line 317. Furthermore, in this mode the control chip 305 is configured to measure a component of the drive signal 304 coupled from the lower electrode 301 to the upper electrode 307 (i.e. the capacitive measurement receive signal) and seen on the upper electrode return line 308 using the control chip's capacitive measurement sense channel. In this mode the apparatus 300 may thus operate in accordance with the general principles of conventional capacitive sensors in which disturbances in the measured mutual-capacitance between a pair of electrodes is monitored and processed to determine whether or not an object is adjacent a sensing region of the sensor element. The presence of the phosphorescent layer 309 and the use of the drive signal selection switch 302 to route the capacitive sensor drive signal 304 from the control chip 305 to the lower electrode 301 does not significantly impact this capacitive measurement aspect of the apparatus 300.

To operate in the EL lamp mode, the control chip 305 controls switch 302 via switching signal 306 such that the EL lamp drive signal 303 from the EL lamp drive signal source 316 is coupled to the lower electrode 301. Furthermore, in this mode the control chip 305 is configured to ground the upper electrode 307 via the upper electrode return line 308. Thus in this mode the apparatus 300 may operate in accordance with the general principles of a conventional EL lamp in which the EL lamp drive signal provides an electric field across a phosphorescent layer between a pair of electrodes to cause the layer to luminesce in the usual way.

Thus in summary of FIG. 4A, the lower electrode 301 is connected to a switching arrangement 302 such that either an EL drive signal 303 is connected to the electrode or a transmit signal 304 suitable for capacitive measurement is connected to the electrode 301. The switch 302 is controlled 306 from the control chip 305. The upper electrode 307 is connected 308 to the control chip 305. The layer of phosphorescent material 309 is arranged to lie below the top electrode 307.

This arrangement allows the control chip to select when the EL lamp is being driven to cause illumination, or when the capacitive touch button is being measured to allow touch detection. In the former case, the EL signal 303 is connected to the lower electrode 301 and the control chip drives the upper electrode 307 to a zero potential (or other DC potential) to allow the correct potential difference to be asserted between the two electrodes and so cause fluorescence. In the latter case, the lower electrode 301 is driven with the capacitive transmit signal and the upper electrode 307 is controlled to allow the proper sequencing to allow a capacitive measurement. As shown, the electrical drive properties of the upper electrode 307 between EL mode and capacitive mode are not intended to be significantly different, allowing direct connection to a chip. However, it will be understood that with the addition of extra circuitry the control chip could cope with capacitive sensing methods that require more complex waveforms to be sensed or driven at the upper electrode.

The touch sensitive region of the sensor (button/key or x, y sensing layer) lies in an area that immediately surrounds the upper electrode 307 and extends outwards to cover some proportion of the overlapping region between the lower electrode 301 and the upper electrode 307. The exact size of the touch sensitive area depends on the width and area of the electrodes. In some examples this touch sensing feature may be most practical when the upper electrode shape can be made with a relatively low surface area to edge ratio. This is because in transmit/receive type capacitive sensing, the electric field distribution tends to be strongest at sharp corners. Large filled areas of conductive material are essentially not touch sensitive and so may not be optimally suited to the transmit/receive capacitive sensing technique. In such cases other capacitive sensing techniques, e.g. those based on measuring the self-capacitance of a single electrode, may be preferred. An advantage of using transmit/receive type capacitive sensing is that generally a larger number of capacitive buttons or keys can be created for a given control chip complexity.

In the EL lamp operational mode, the EL lamp is formed between the lower electrode 301 and the upper electrode 307 in regions where they directly overlap. In this way the upper electrode 307 effectively lights up when the EL lamp is enabled. To allow the light to propagate to the user, the upper electrode 307 is created from a transparent material like ITO or PEDOT.

In normal use the control chip 305 may be configured to modulate the switching signal 306 to the switch 302 such that the apparatus switches between the capacitive sensing mode and the EL lamp mode sufficiently quickly that a user perceives the sensor element 312 to be continuously illuminated and continuously responsive to touch. That is to say, capacitance measurement samples using the capacitance measurement mode of operation may be alternated with bursts of illumination using the EL lamp mode of operation.

Thus embodiments may provide for an illuminatable capacitive touch sensor having a simpler and more compact construction requiring fewer separate components than known devices.

Figure 4B:
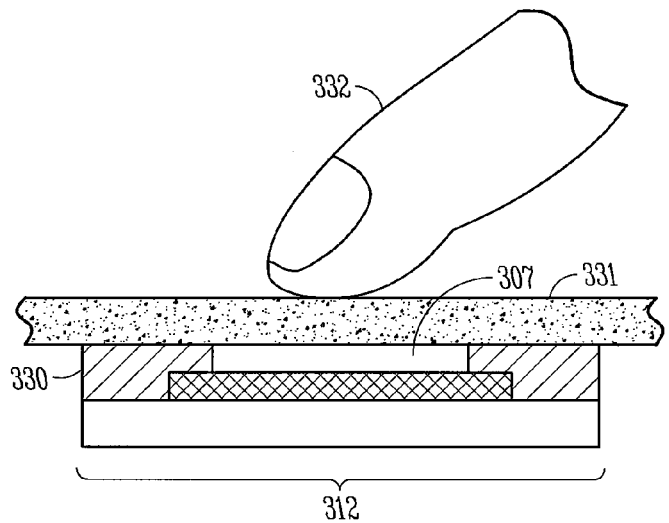
FIG. 4B schematically shows further aspects of some features of the sensor of FIG. 4A.

Referring to FIG. 4B, the sensor element structure 312 of the sensor apparatus 300 of FIG. 4A is shown glued or otherwise bonded with some space filling adhesive 330 to an overlying insulating panel 331, so that a touch 332 does not contact the sensor's upper electrode 307 directly. This may be helpful for some embodiments because direct contact with sensors may have safety issues and can also be problematic with regard to Electro Static Discharge (ESD).

As noted above, by time-multiplexing the EL lamp operation and the capacitive measurements, the same pair of electrodes can be used to create a combination of touch sensor and EL lamp, with the desirable feature in this case that the illuminated area of the EL lamp is the same shape of the upper electrode 307.

Figure 5A:
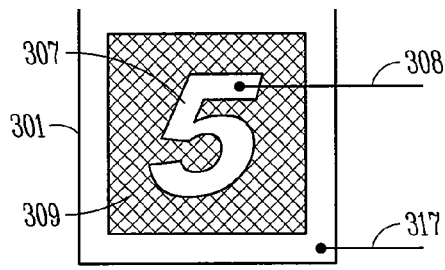
FIGS. 5A to 5C schematically show features of an illuminated sensor according to an embodiment.
Figure 5B:
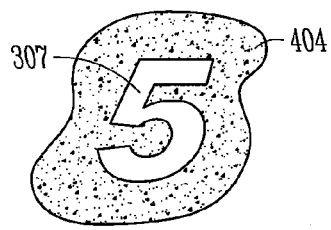
Figure 5C:
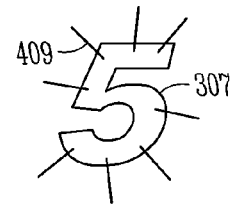

FIGS. 5A to 5C schematically show plan views of a sensor element constructed in accordance with the principles described above with reference to FIGS. 4A and 4B. Elements which are similar to and will be understood from corresponding elements of FIGS. 4A and 4B are identified by the same reference numerals. Thus it can be seen the upper electrode 307 may be made into a shape so that it represents some graphic, symbol or icon (in this example a number "5"). The phosphorescent material 309 and the lower electrode 301 are arranged to larger in size than the upper electrode 307. In the capacitive sensing mode of operation, the apparatus becomes touch sensitive over a sensing region 404 (schematically indicated in FIG. 5B) in the usual way. The exact extent and degree of sensitivity of the sensing region 404 will depend on geometric features of the sensor element, the nature of the capacitance measurement drive signal, and the sense channel sensitivity, and so on, in the usual way for capacitive sensors.

In the EL lamp mode of operation, the region of the apparatus corresponding to the upper electrode 307 (or more particularly the region of phosphorescent material 309 behind the upper electrode) luminesces (as schematically indicated in FIG. 5C by radiation 409) in the usual way. The brightness and color of the luminescence will depend on geometric features of the sensor element, the nature of the phosphorescent material, the EL lamp drive signal, and so on, in the usual way for an EL lamp.

The changeover and hold times of the switching arrangement 302 may be selected such that the EL lamp does not visibly flicker to any significant extent, but fast enough to give a good user experience for the touch sensor i.e. perceived fast response time (typically corresponding to less than 100 ms to activate). The human persistence of vision means that a user will typically not notice when the EL lamp is disabled briefly for making the capacitance measurement on the touch sensor (button).

In an alternative embodiment, an apparatus comprising a similar combined EL and capacitive touch sensor may be realized with only the upper electrode being part of the touch sensing.

Figure 6:
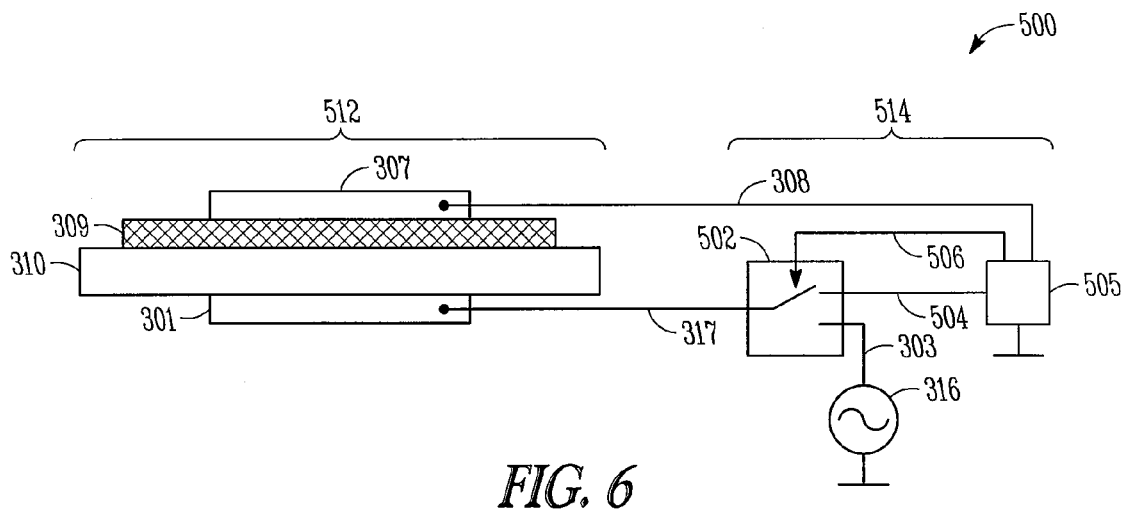
FIG. 6 schematically shows aspects of an apparatus comprising a combined EL lamp and a capacitive type touch sensor according to another embodiment.

FIG. 6 schematically shows an apparatus 500 comprising a combined EL lamp and capacitive type touch sensor for providing an illuminated capacitive sensing region according to another embodiment of the invention. Many aspects of this embodiment are similar to those of the example shown in FIGS. 4A and 4B, but in the example shown in FIG. 5 the touch sensing aspect of the design is realized using only an upper electrode.

As with the apparatus 300 shown in FIGS. 4A and 4B, the apparatus 500 of FIG. 6 may be broadly considered to comprise a structural component 512 (which may also be referred to as the sensor element) and an associated circuitry component 514 for controlling the illuminatable sensor element 512.

The sensor element component 512 of the apparatus 500 of FIG. 6 may be broadly the same as the sensor element component 312 of the apparatus 300 of FIGS. 4A and 4B. Corresponding elements are identified by the same reference numerals and are not described again in the interest of brevity. Thus the sensor element component 512 of the apparatus 500 of FIG. 6 has a generally layered structure comprising a first (lower) electrode 301, a substrate 310, a layer of phosphorescent material 309, and a second (upper) electrode 307.

Some aspects of the circuitry component 514 of the apparatus 500 of FIG. 6 are also similar to and will be understood from correspondingly numbered elements in FIGS. 4A and 4B. However, some aspects of the circuitry component 514, in particular relating to the capacitive measurement functionality, are different. Thus the circuitry component 514 of the apparatus of FIG. 6 comprises an EL drive source 316 for providing an EL drive signal 303 to the sensor element 512 and a control chip 505 comprising a conventional "single-electrode" self-capacitive measurement channel coupled to the upper electrode 307. The principles underlying the EL drive signal source 316 for the EL drive signal 303 and the self-capacitive measuring channel of the control chip 505 may be broadly conventional.

The circuitry component 514 of the apparatus 500 further comprises a switch 502 arranged to selectively couple the lower electrode to the EL drive signal source 316, or to a fixed reference potential 504 in response to a switching signal 506 provided by the control chip 505 on a switch line from the control chip 505 to the switch 502. The switch 502 is coupled to the lower electrode 301 via lower electrode drive line 317. The upper electrode 307 is coupled to the control chip 505 via upper electrode return line 308.

As before, the apparatus 500 of FIG. 6 is operable to function in both a capacitive sensing mode (i.e. having a touch-sensing function) and in an EL lamp mode (i.e. having an EL lamp function).

To operate in the capacitive sensing mode, the control chip 505 controls switch 502 via switching signal 506 such that the lower electrode is held at the fixed reference potential 506 from the control chip 505 via the lower electrode drive line 317. Furthermore, in this mode the control chip 505 is configured to couple its self-capacitance measurement channel to the upper electrode 307 via the upper electrode return line 308. In this mode the apparatus 500 may thus operate in accordance with the general principles of conventional single-electrode capacitive sensors in which disturbances in the measured self-capacitance of the upper electrodes 307 are monitored and processed to determine whether or not an object is adjacent a sensing region in the vicinity of the upper electrode in the usual way for capacitive sensing techniques.

It may be noted the presence of the lower electrode 301 at the fixed reference potential provides a degree of screening of the measured self-capacitance of the upper electrode 307 from objects located below the sensor element 512. In some cases this may be desirable, e.g. to reduce sensitivity to nearby sources of electrical noise. However, in some circumstances maintaining the lower electrode 301 at a fixed potential might reduce the overall sensitivity of the measured self-capacitance of the upper electrode 307 to adjacent pointing objects. In cases where this is a concern, the control chip 505 and switch 502 may instead be configured such that the lower electrode is left to float (rather than being coupled to a fixed potential from the control chip) while the apparatus is in capacitive sensing mode.

To operate in the EL lamp mode, the control chip 505 controls switch 502 via switching signal 506 such that the EL lamp drive signal 303 from the EL lamp drive signal source 316 is coupled to the lower electrode 301. Furthermore, in this mode the control chip 505 is configured to ground the upper electrode 307 via the upper electrode return line 308. Thus in this mode the apparatus 300 may again operate in accordance with the general principles of a conventional EL lamp to cause the phosphorescent layer 309 to luminesce in the usual way.

Thus to summarize the design of FIG. 6, the lower electrode 301 is again connected to a switching arrangement 502 that allows the control chip 505 to select between the EL drive signal 303 and some other signal 504. The upper electrode 307 is connected directly to the control chip 505. In this configuration, the upper electrode 307 may be either connected to zero potential (or some other DC potential) to allow the EL mode to operate when the switch 502 is configured to connect the EL drive signal 303 to the lower electrode 301, or it can form part of a conventional self-capacitance capacitive sensing circuit, such as previously described. When used in capacitive sensing mode, the lower electrode 301 may be switched to either a zero (or other reference) potential by the control chip 505, or could be "floated" to a high impedance state so as not to desensitize the capacitive touch button. This later method has a disadvantage that capacitive changes below the touch sensor can be measured because the floating electrode will tend to re-radiate the capacitive measurement signal. A third possibility exists that would drive the lower electrode 301 with a facsimile of the drive waveform applied to the upper electrode 307 during capacitance measurement. This method is well known in the art as a so called "driven shield" and has the advantage that the sensitivity of the touch button can be improved while also reducing sensitivity to capacitive changes that are not introduced from the upper side of the sensor.

The embodiment of FIG. 6 differs from the embodiment of FIGS. 4A and 4B in that the touch sensitive region is now defined only by the upper electrode area. Again, the upper electrode is constructed from transparent material so that it illuminates when in EL mode, but when in capacitive mode, only the area of the electrode is touch sensitive. This approach may be better in cases when large surface area to edge ratio electrodes are desired, such a rectangles or circles. A decorative mask can be used if desired to create the impression of symbols, lettering or icons etc. This mask can be placed over the upper layer electrode in any way appropriate to the physical construction that is employed. Another way to make selective illumination is to shape the lower electrode to be the symbol, icon etc that is desired to be illuminated.

Figure 7:
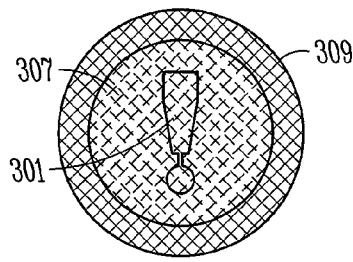
FIG. 7 schematically shows features of an illuminated sensor according to an embodiment.

This is schematically shown in FIG. 7 in which the upper electrode 307 is a simple shape (consistent with the majority of touch buttons), in this case a circle, the layer of phosphorescent material 309 is in this example substantially the same size/shape and lies under the upper electrode 307, and the lower electrode 301 defines the shape of the desired illuminated area (in this example an exclamation mark "!"). In an example such as this, it may be helpful for the lower electrode drive line 317 (not shown in FIG. 7) connected to the lower electrode 301 to using tracks/traces that run away from the phosphor region on a lower circuit layer, or perhaps behind a shield track. This is to prevent illumination of the phosphor layer above the tracks. Another approach would be to mask the phosphor from regions directly above such tracks, or to apply phosphor only directly over the region that is to be illuminated. The tradeoffs for each method can be assessed to find an optimal solution according to the application at hand. A potential disadvantage with this approach for some applications is that the touch sensitive region formed by the upper electrode 307 is not fully overlapped by the lower electrode 301, and so capacitive changes below the sensor element 512 can register at the control chip 305 (and are indistinguishable from capacitive changes caused by a pointing object to which the apparatus is intended to be sensitive).

In the above-described example embodiments, the respective control chips are configured to activate their respective switches to alternate between the EL lamp mode and the capacitance sensing mode of operation. However, in other embodiments the EL lamp mode of operation and the capacitive measurement mode of operation might be activated simultaneously (i.e. no switching between them).

Figure 8:
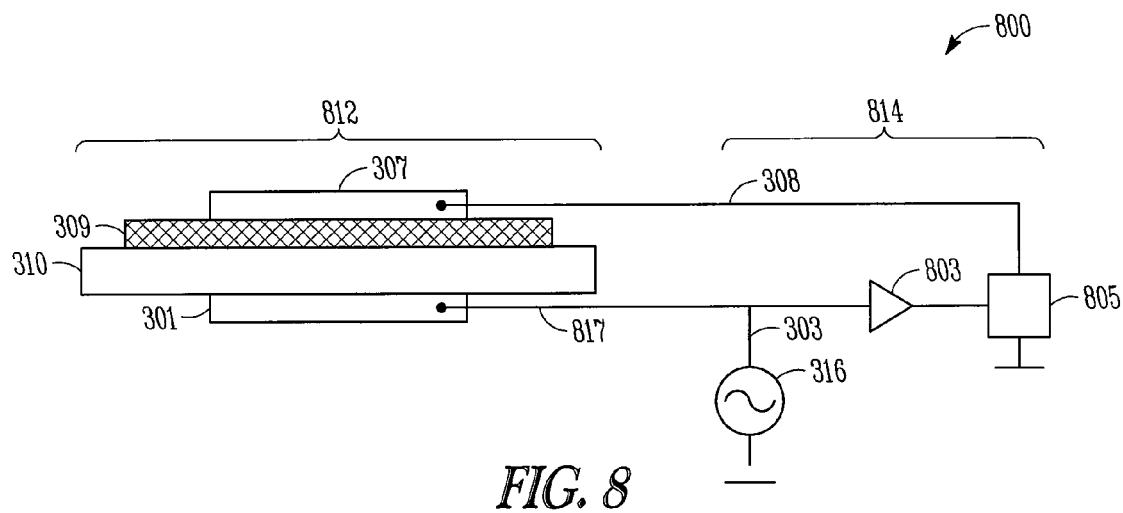
FIG. 8 schematically shows aspects of an apparatus comprising a combined EL lamp and a capacitive type touch sensor according to another embodiment.

FIG. 8 schematically shows an apparatus 800 comprising a combined EL lamp and capacitive type touch sensor for providing an illuminated capacitive sensing region according to such an embodiment. Many aspects of this embodiment are similar to those of the example shown in FIG. 6.

As with the apparatus 500 shown in FIG. 6, the apparatus 800 of FIG. 8 may be broadly considered to comprise a structural component 812 (which may also be referred to as the sensor element) and an associated circuitry component 814 for controlling the illuminatable sensor element 812.

The sensor element component 812 of the apparatus 800 of FIG. 8 may again be broadly the same as the sensor element component 312 of the apparatus 300 of FIGS. 4A and 4B. Corresponding elements are identified by the same reference numerals and are not described again in the interest of brevity. Thus the sensor element component 812 of the apparatus 800 of FIG. 8 has a generally layered structure comprising a first (lower) electrode 301, a substrate 310, a layer of phosphorescent material 309, and a second (upper) electrode 307.

Some aspects of the circuitry component 814 of the apparatus 800 of FIG. 8 are also similar to and will be understood from correspondingly numbered elements in FIGS. 4A and 4B and FIG. 6. However, some aspects of the circuitry component 814, in particular relating to the coupling of the EL lamp drive signal to the lower electrode 301, are different. Thus the circuitry component 814 of the apparatus of FIG. 8 comprises an EL drive source 316 for providing an EL drive signal 303 to the sensor element 512 and a control chip 805 comprising a conventional "single-electrode" self-capacitive measurement channel coupled to the upper electrode 307. The principles underlying the EL drive signal source 316 for the EL drive signal 303 and the self-capacitive measuring channel of the control chip 805 may again be broadly conventional.

However, unlike the circuitry component 514 of the apparatus 500, the circuitry component 814 of the apparatus 800 of FIG. 8 does not comprise a switch to selectively couple the EL drive signal 303 from the EL drive signal source 316 to the lower electrode 301. Instead the EL drive signal source 316 is coupled directly to the lower electrode 301 via lower electrode drive line 817. In addition, the EL drive signal 303 from the EL drive signal source 316 is coupled in parallel to the control chip 805, in this example via signal buffer 803. The signal buffer in this example is a simple series resistor and serves to reduce the voltage of the EL drive signal 303 input to the control chip 805 to reduce the risk of damage (typically the control chip will not be configured to handle the typical voltage levels associated with EL lamp drive signals). The upper electrode 307 is coupled to the control chip 805 via upper electrode return line 308 in the same manner as described above for the embodiment shown in FIG. 6.

As above, the apparatus 800 of FIG. 8 is provides a capacitive sensing mode (i.e. having a touch-sensing function) and an EL lamp mode (i.e. having an EL lamp function). However, the two modes can operate simultaneously.

Thus to summarize the embodiment of FIG. 8, in many respects it may be operated in accordance with a control scheme broadly similar to that described in relation to the embodiment of FIG. 6. However, rather than actively disconnecting the EL lamp drive signal from the lower electrode during the time in which a capacitance measurement is made (i.e. by appropriate switching), the EL lamp drive signal remains coupled to the lower electrode 301 all the time the lamp is desired to be on. To operate in this way the control chip 805 senses the EL drive signal 303 via the signal buffer 803, as shown in FIG. 8 by the various connections. Thus lower electrode 301 is only connected to the EL drive signal 303, which is also buffered at 803 for connection to the control chip 805. In its simplest form the buffer may be just a resistor, as noted above, or resistive attenuator. As also noted above, connection from the control chip 805 to the upper electrode 307 is the same as in the embodiment shown in FIG. 6. Thus the control chip 805 senses the EL drive signal and is operable to perform capacitive measurements when the voltage amplitude associated with the EL lamp drive signal applied to the lower electrode 301 is at a phase where it least effects the capacitive measurement (often at a zero crossing in the waveform, or when the rate of change of voltage with time is minimized). In this way, the control chip can synchronise its capacitance measurements to obtain the best result possible without turning off the EL lamp. The capacitance measurements themselves are otherwise performed in the usual way. It will be appreciated during the periods between capacitive measurements the control chip 805 may be configured to hold the upper electrode 307 to a suitable potential, e.g. ground, relative to the EL lamp drive signal 303 such that the EL lamp functions in the normal manner.

Figure 9A:
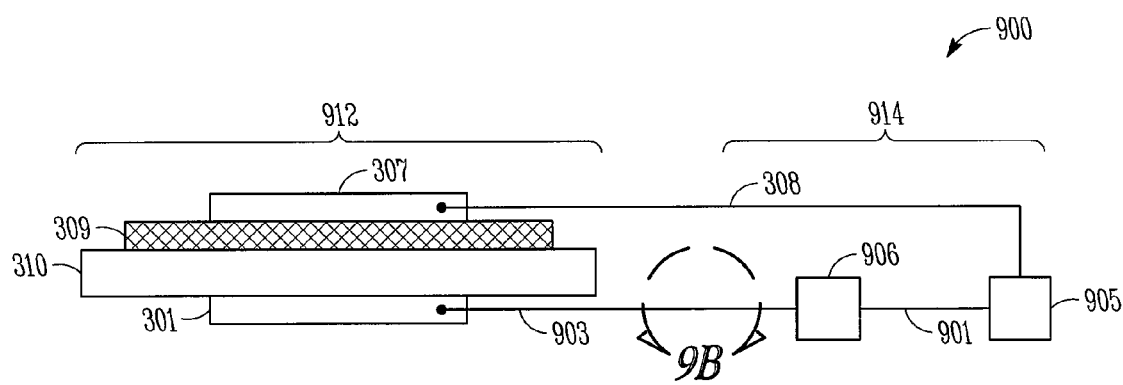
FIGS. 9A and 9B schematically show aspects of an apparatus comprising a combined EL lamp and a capacitive type touch sensor according to yet another embodiment.

FIG. 9A schematically shows an apparatus 900 comprising a combined EL lamp and capacitive type touch sensor for providing an illuminated capacitive sensing region according to another embodiment.

As with the apparatus of other embodiments described above, the apparatus 900 of FIG. 9A may be broadly considered to comprise a structural component 912 (which may also be referred to as the sensor element) and an associated circuitry component 914 for controlling the illuminatable sensor element 912.

The sensor element component 912 of the apparatus 900 of FIG. 9A is again broadly the same as the sensor element component 312 of the apparatus 300 of FIGS. 4A and 4B with corresponding elements are identified by the same reference numerals.

The circuitry component 914 of the apparatus 900 of FIG. 9A comprises a control chip 905 comprising a conventional "single-electrode" self-capacitive measurement channel coupled to the upper electrode 307. The circuitry component 914 further comprises an EL drive signal amplifier 906 arranged to receive a waveform 901 generated by the control chip 905, and to amplify the waveform to a suitable voltage level to provide an EL lamp drive signal 903 to apply to the lower electrode.

Figure 9B:
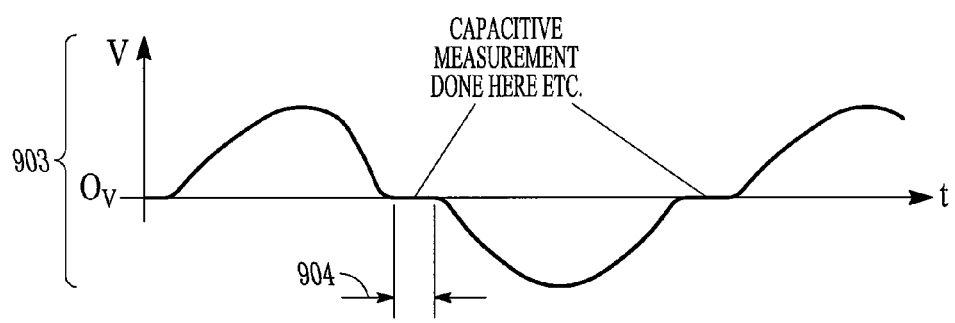

Thus in accordance with the embodiment shown in FIG. 9A, the control chip 905 itself defines the EL drive signal timing and wave shape 903 (FIG. 9B) to apply to the lower electrode 301 (following suitable amplification by amplifier 906). An example EL drive signal 903 in terms of voltage V as a function of time t is schematically shown in FIG. 9B. Because the control chip 905 itself defines the EL drive signal timing and wave shape 903, the control chip may be operable to internally synchronize its capacitive measurement and if desired it can "blank" the EL signal 903 for a blanking period 904 that is long enough to make a capacitive measurement with minimal interruption to the EL lamp on-time. This approach also means that the capacitive measurement may be less affected by the EL drive signal than for examples such as shown in FIG. 8. During the blanking period, a "driven shield" method could also be employed as previously discussed, to drive the lower electrode 301 in such a way as to neutralise capacitive effects at the rear of the sensor.

What is claimed is:

1. A capacitive touch sensor comprising:
   a substrate;
   a layer of electro-luminescent (EL) material arranged between a first electrode and a second electrode; and a controller comprising a capacitance sensing circuit coupled to at least one of the first and second electrodes and arranged to measure a capacitive coupling associated therewith, wherein the controller is further operable to apply an EL drive signal across the first and second electrodes to cause the layer of EL material between the electrodes to illuminate, the substrate distinct from the EL material and positioned between the first electrode and second electrode.

2. A capacitive touch sensor according to claim 1, wherein the controller is operable to respectively apply the EL drive signal and to measure the capacitive coupling associated with the coupled electrode or electrodes in a time-multiplexed manner.

3. A capacitive touch sensor according to claim 1, wherein the controller is operable to apply the EL drive signal and to measure the capacitive coupling associated with the coupled electrode or electrodes simultaneously.

4. A capacitive touch sensor according to claim 3, wherein the controller is operable to measure the capacitive coupling associated with the coupled electrode or electrodes at a predefined phase of the EL drive signal.

5. A capacitive touch sensor according to claim 4, wherein the predefined phase of the EL drive signal is a zero crossing of the EL drive signal.

6. A capacitive touch sensor according to claim 4, wherein the predefined phase of the EL drive signal is a phase at which a rate of change of the EL drive signal with time is minimized.

7. A capacitive touch sensor according to claim 1, wherein the EL drive signal includes a blanking period, and the controller is operable to measure the capacitive coupling associated with the coupled electrode or electrodes during the blanking period.

8. A capacitive touch sensor according to claim 7, wherein the blanking period is a period in which the EL drive signal is maintained at a reference potential.

9. A capacitive touch sensor according to claim 1, further comprising an EL signal amplifier for amplifying a signal from the controller in order to provide the EL drive signal.

10. A capacitive touch sensor according to claim 1, wherein the capacitance sensing circuit comprises a drive circuit operable to apply a capacitance measurement drive signal to the first electrode, and a receive circuit operable to measure a component of the drive signal capacitively coupled to the second electrode as an indication of the capacitive coupling between the first and second electrodes.

11. A capacitive touch sensor according to claim 10, further comprising a switch arranged to selectively couple one or the other of the EL drive signal and the capacitance measurement drive signal to the first electrode in response to a switching signal from the controller.

12. A capacitive touch sensor according to claim 1, wherein the capacitance sensing circuit is coupled to the second electrode and is operable measure a capacitive coupling of the second electrode to a reference potential.

13. A capacitive touch sensor according to claim 12, further comprising a switch arranged to selectively couple one or the other of the EL drive signal and either a reference potential, a floating potential, or a facsimile of a signal applied to the second electrode, to the first electrode in response to a switching signal from the controller.

14. A capacitive touch sensor according to claim 1, wherein the at least one of the first and second electrodes has a shape selected to correspond to a desired illumination pattern for the touch sensor.

15. A capacitive touch sensor according to claim 1, wherein at least one of the first and second electrodes is transparent.

16. A capacitive touch sensor according to claim 1, further comprising an insulating panel overlying the electrodes and the layer of EL material.

17. A capacitive touch sensor according to claim 1, further comprising a decorative mask overlying the electrodes and the layer of EL material.

18. A capacitive touch sensor according to claim 1, wherein the first electrode has a greater extent than the second electrode.

19. A capacitive touch sensor according to claim 1, wherein a connection trace to at least one of the first and second electrodes is arranged to run away from the layer of EL material.

20. A capacitive touch sensor according to claim 1, wherein the controller is further operable to process measured changes in the capacitive coupling to detect the presence of an object adjacent the touch sensor.

21. The capacitive touch sensor according to claim 1, wherein:
the first electrode is positioned on a first side of the substrate; and
the second electrode is positioned on a second side of the substrate, the second side of the substrate being opposite the first side of the substrate, the EL material positioned between the second electrode and the substrate.

* * * * *